US005627535A

United States Patent [19]

Ichimura et al.

[11] Patent Number: 5,627,535
[45] Date of Patent: May 6, 1997

[54] QUANTIZATION APPARATUS

[75] Inventors: Gen Ichimura, Tokyo; Masayoshi Noguchi, Chiba; Yuichi Inomata, Tokyo, all of Japan

[73] Assignee: Sony Corporation, Japan

[21] Appl. No.: 302,539

[22] Filed: Sep. 8, 1994

[30] Foreign Application Priority Data

Sep. 10, 1993 [JP] Japan .................................... 5-225717

[51] Int. Cl.$^{6}$ ........................................ H03M 1/20
[52] U.S. Cl. ........................................ 341/131; 341/95
[58] Field of Search .............................. 341/95, 131, 143, 341/159

[56] References Cited

U.S. PATENT DOCUMENTS

| | | | |
|---|---|---|---|
| 4,638,506 | 1/1987 | Han | 381/34 |
| 4,845,498 | 7/1989 | Kubo et al. | 341/131 |
| 5,040,220 | 8/1991 | Iwamatsu | 381/63 |
| 5,073,777 | 12/1991 | Fukuhara et al. | 341/131 |
| 5,073,778 | 12/1991 | Ueki et al. | 341/131 |

FOREIGN PATENT DOCUMENTS

| | | | |
|---|---|---|---|
| 0369630A2 | 5/1990 | European Pat. Off. | H04B 14/04 |
| 0376553A2 | 7/1990 | European Pat. Off. | H04B 1/66 |
| 2261783 | 5/1993 | United Kingdom | H03H 17/02 |

*Primary Examiner*—Todd E. DeBoer
*Attorney, Agent, or Firm*—Limbach & Limbach L.L.P.

[57] ABSTRACT

A quantization apparatus for quantizing and word length limiting digitized stereo input signals including a stereo dither signal generating unit for generating stereo dither signals synthesized from at least two distinct dither signals not correlated to each other at an arbitrary ratio, a first addition unit for adding one of the stereo dither signals to one of the digital stereo input signals, a second addition unit for adding the other of the stereo dither signals to the other of the digital stereo input signals, a first quantization unit for quantizing and word length limiting an output signal of the first addition unit, and a second quantization unit for quantizing and word length limiting an output signal of the second addition unit. With the present quantization device, the stereo input signals may be quantized while cross-correlation between the left and right channel stereo input signals is maintained.

15 Claims, 6 Drawing Sheets

QUANTIZATION APPARATUS

BACKGROUND OF THE INVENTION

This invention relates to a quantization apparatus and, more particularly, to a quantization apparatus in which digitized stereo input signals are processed with quantization and word length limitation.

In certain prior-art apparatus for quantization, a dither addition circuit is provided for improving reproducibility by alleviating dropout of the information of weak intensity signals produced on quantization and word length limitation.

With such quantization apparatus, as disclosed in JP Patent Kokai (laid-Open) Patent Publication No. 05-145376 (1993), a dither addition circuit is provided upstream of a quantizer for adding dither signals to digital data in order to prevent failure in the waveform or level shifting and consequent deterioration in reproducibility due to word length limitation by rounding or half-adjustment during quantization of digital data by the quantizer and consequent dropout in the information contained in substantially sinusoidal pre-quantization weak-intensity signals. In this case, if, after quantization of the dither signals added to the digital data, a pre-set number of the lower bits are rounded or half-adjusted, the information proper to the minute or weak-intensity signals contained in the input signal is left in the quantized data for further alleviating the failure in the information of the minute weak-intensity signals induced by the word length limitation.

If, when the right-channel digital stereo signals and the left-channel digital stereo signals are supplied to a quantizer for the right channel and to a quantizer for the left channel, respectively, the same dither signals or dither signals not correlated with each other are supplied to left-channel and right-channel dither addition circuits provided upstream of the quantizers, the correlation between the left and right channels, proper to the stereo input signals, is deteriorated.

For example, if the same dither signals, having the cross-correlation coefficient equal to unity, are supplied to the left and right dither addition signals, the cross-correlation of signal components having inherently low left channel—right channel correlation is increased. Specifically, the ambience feeling created by the reverberating stereophonic components in music signals is not spread sufficiently towards left and right, but is collected towards a center position.

On the other hand, if the dither signals not correlated with each other, such as the dither signals having the cross-correlation coefficient equal to zero, are supplied to the left and right dither addition circuits, the cross-correlation of signal components having the left channel-right channel correlation coefficient equal to unity is decreased. Specifically, the sound image of the sound having a fixed center sound source position feeling becomes; blurred and spread toward left and right.

SUMMARY OF THE INVENTION

In view of the above-described status of the prior art, it is an object of the present invention to provide a quantization apparatus unsusceptible to deterioration of the cross-correlation in the stereophonic signals.

The present invention provides a quantization apparatus for quantizing and word length limiting digitized stereo input signals including a stereo dither signal generating unit for generating stereo dither signals synthesized from distinct dither signals of at least two channels not correlated to each other at an arbitrary ratio, a first addition unit for adding one of the stereo dither signals to one of the digital stereo input signals, a second addition unit for adding the other of the stereo dither signals to the other of the digital stereo input signals, a first quantization unit for quantizing and word length limiting an output signal of the first addition unit, and a second quantization unit for quantizing and word length limiting an output signal of the second addition unit.

The stereo dither signal generating circuit preferably has a dither signal generator dedicated to a left channel, a dither signal generator dedicated to a right channel and at least one dither signal generator common to both the left and right channels.

It is also possible for the stereo dither signal generator to calculate the cross-correlation of the stereo input signals at an arbitrary time interval and to adjust the mixing ratio of the non-correlated dither signals of at least three routes so that the stereo signal will have cross-correlation proportional to the cross-correlation value.

With the quantization apparatus of the present invention, quantization may be achieved while maintaining cross-correlation between left and right channels proper to the stereo input signals.

The stereo dither signal generator includes an analyzer for analyzing the cross-correlation coefficients of the stereo input signals at a pre-set time interval, and a coefficient calculator for calculating cross-correlation coefficients of the stereo dither signals based upon the cross-correlation coefficients of the stereo input signals obtained from the analysis unit. The stereo signal generating unit generates stereo dither signals having a cross-correlation coefficient equal to the cross-correlation coefficient of the stereo input signal or to an arbitrary number multiple of the cross-correlation coefficient of the stereo input signal. In this manner, quantization may be achieved while maintaining cross-correlation between left and right channels proper to the stereo input signals, and the failure in the information concerning the cross-correlation between left and right channels proper to the stereo input signals may be decreased.

DESCRIPTION OF PREFERRED EMBODIMENTS

Figure 1:
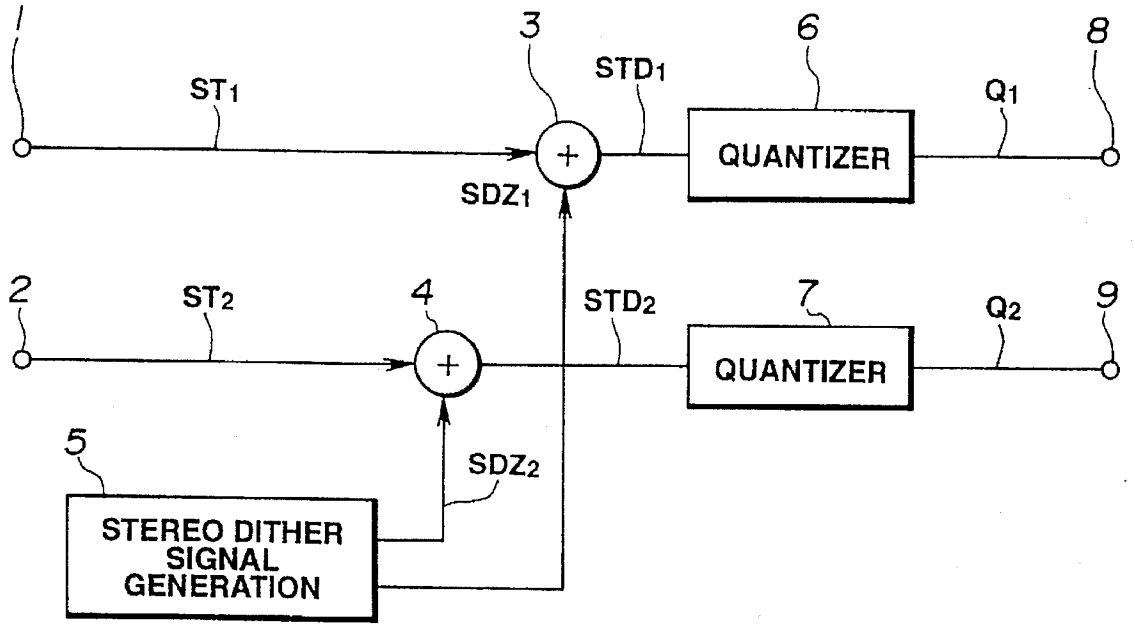
FIG. 1 is a block circuit diagram showing an arrangement of a first embodiment of the apparatus for quantization according to the present invention.

Referring to the drawings, preferred embodiments of the quantization apparatus according to the present invention will be explained in detail.

Referring first to FIGS. 1 to 4, a first embodiment is explained.

One $ST_1$ of digitized stereo input signals, supplied via an input terminal 1, are supplied to a first dither addition circuit 3. The other $ST_2$ of the digitized stereo input signals, supplied via the input terminal 1, is supplied to a second dither addition circuit 4.

To the first dither addition circuit 3 and to the second dither addition circuit 4, stereo dither signals $SDZ_1$ and $SDZ_2$ are also supplied from a stereo dither signal generator 5. Thus the first dither addition circuit 3 sums the stereo dither signals $SDZ_1$ to the stereo input signal $ST_1$. The second dither addition circuit 4 sums the stereo dither signals $SDZ_2$ to the stereo input signal $ST_2$.

A sum output $STD_1$ of the first dither addition circuit 3 is supplied to a first quantizer 6, while a sum output $STD_2$ of the second dither addition circuit 4 is supplied to a second quantizer 7. The first quantizer 6 processes the sum output $STD_1$with quantization and word length limitation and routes a quantized output $Q_1$ to an output terminal 8. The second quantizer 7 processes the sum output $STD_2$ with quantization and word length limitation and routes a quantized output $Q_2$ to an output terminal 8.

In the first embodiment, the stereo input signal is a 20 bit signal, while an output signal is a 16-bit signal and the stereo dither signal is a 4-bit signal. By adding the dither signal to the lower four bits of the stereo input signal, the information owned by minute weak-intensity signals of the stereo input signal is left in the output signal even after quantization from 20 bits to 16 bits.

Figure 2:
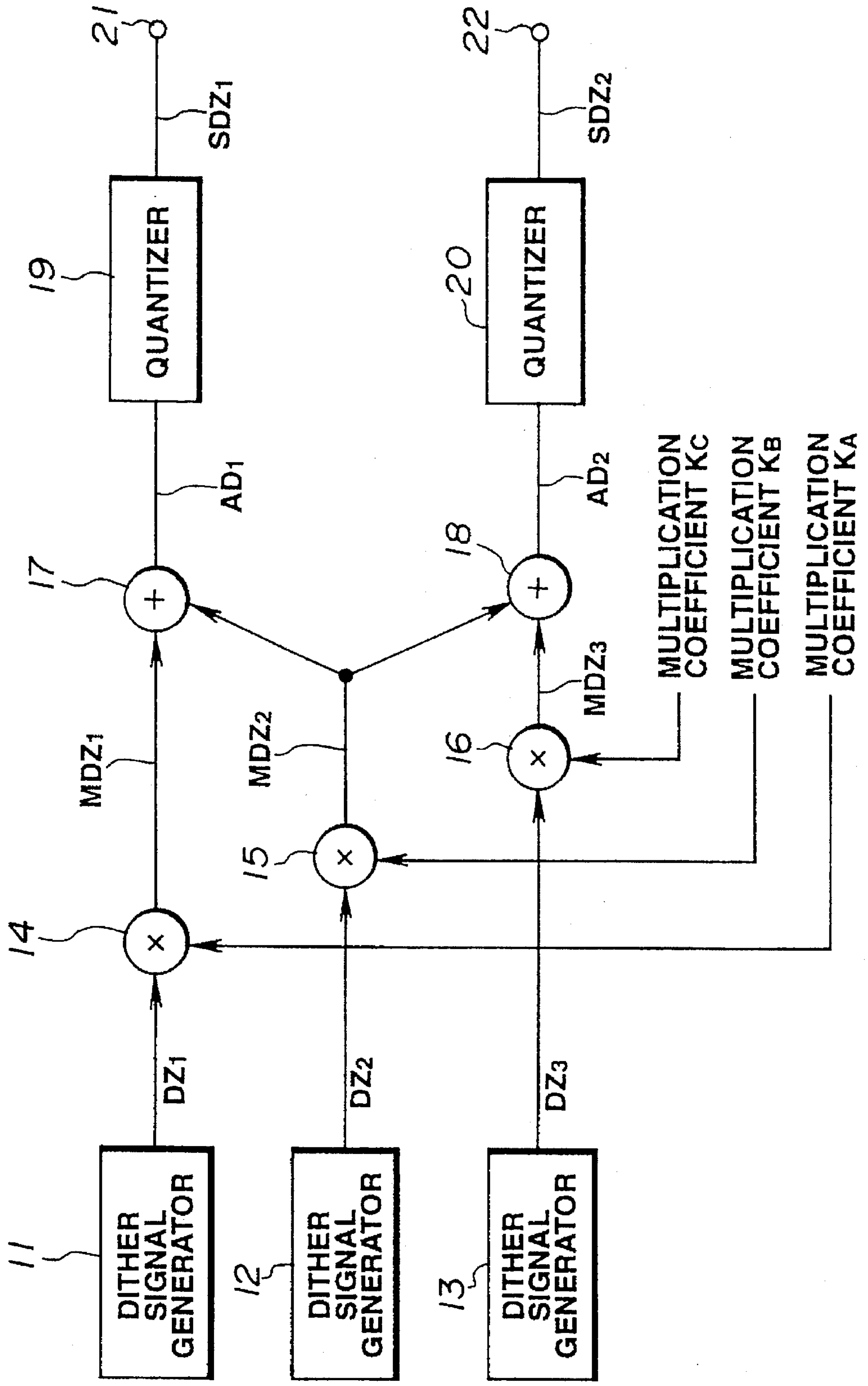
FIG. 2 is a block circuit diagram showing an arrangement of a stereo dither signal generating circuit in the embodiment shown in FIG. 1.

Referring to FIG. 2, the stereo dither signal generator 5 includes three dither signal generators 11, 12 and 13 for generating non-correlated dither signals $DZ_1$, $DZ_2$ and $DZ_3$ of three different routes, respectively, and multipliers 14, 15 and 16 for multiplying the dither signals $DZ_1$, $DZ_2$ and $DZ_3$ from the dither signal generators 11 to 13 with optional multiplication coefficients $K_A$, $K_B$ and $K_C$, respectively. In addition, the generator 5 includes an addition circuit 17 for adding multiplication outputs $MDZ_2$ and $MDZ_1$ among multiplication outputs $MDZ_1$, $MDZ_2$ and $MDZ_3$ of the multipliers 14, 15 and 16, to each other, an addition circuit 18 for adding the multiplication outputs $MDZ_2$ and $MDZ_3$ to each other, and quantizers 19, 20 for quantizing and word length limiting sum outputs $AD_1$ and $AD_2$ from the addition circuits 17, 18. The stereo dither signals $SDZ_1$ and $SDZ_2$ are outputted by these quantizers 19, 20 so as to be supplied via output terminals 21, 22 to the first dither addition circuit 3 and to the second dither addition circuit 4, shown in FIG. 1, respectively.

The dither signal generator 11 generates dither signals for the left channel, the dither signal generator 13 generates dither signals for the right channel, and the dither signal generator 12 generates dither signals for the both the left and right channels.

Thus the stereo dither signal generator 5 adds to the product $MDZ_1$, obtained by multiplying the left channel dither signal $DZ_1$, generated by the dither signal generator 11, with the multiplication coefficient $K_A$, and to the product $MDZ_3$, obtained by multiplying the right channel dither signal $DZ_3$, generated by the dither signal generator 13, with the multiplication coefficient $K_C$, the product $MDZ_2$ obtained by multiplying the dither signal $DZ_2$ for both the lest and right channels, generated by the dither signal generator 12, with the multiplication coefficient $K_b$, to produce the results of addition $AD_1$ an $AD_2$, which are quantized and word length converted in order to produce stereo dither signals $SDZ_1$ and $SDZ_2$ having arbitrary cross-correlation coefficients.

The cross-correlation coefficients owned by the stereo dither signals $SDZ_1$ and $SDZ_2$, that is the stereo dither cross-correlation coefficients, will be explained by referring to FIGS. 3 and 4.

Figure 3:
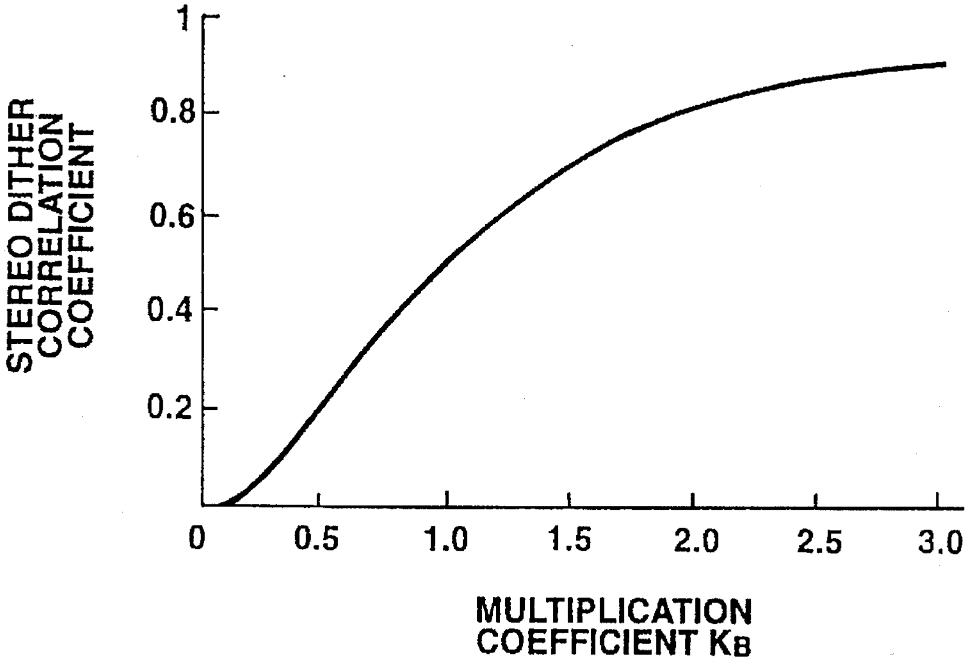
FIG. 3 is a graph showing the cross-correlation coefficients of the stereo dither signals.
Figure 4:
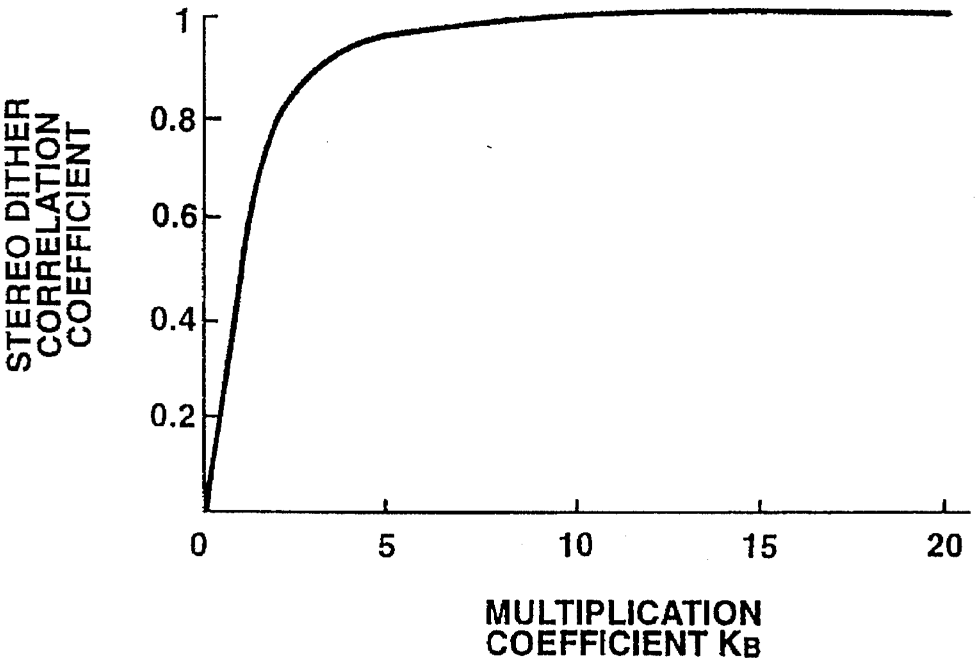
FIG. 4 is a graph showing the cross-correlation coefficients of the stereo dither signals.

The graphs of FIGS. 3 and 4 show the relation between the mixing ratio of the dither signals and the stereo dither signals generated as described above, with the multiplication coefficients $K_a$, $K_C$ being both "1" and the multiplication coefficient $K_B$ being increased from "0", with the cross-correlation function of the stereo dither signals $SDZ_1$, $SDZ_2$ being plotted on the vertical axis. FIGS. 3 and 4 illustrate the cases wherein the multiplication coefficient $K_B$ on the horizontal axis is increased from "0" to "3" and from "0" to "20", respectively.

In any of these cases, the cross-correlation coefficient is "0" for the multiplication coefficient $K_B$ equal to "0" and becomes "0.5" for the multiplication coefficient $K_B$ equal to "1". With increase in the value of the multiplication coefficient $K_b$, the cross-correlation coefficient becomes closer to "1".

Thus the cross-correlation coeificient may be changed by changing the multiplication coefficient $K_B$, such that stereo dither signals having an arbitrary cross-correlation coefficient may be generated.

If, when supplying the multiplication output $MDZ_2$, obtained on changing the multiplication coefficient $K_B$, to the addition circuits 17 and 18, the multiplication output $MDZ_2$ supplied to the addition circuit 17 or 18 is of a minus sign, it becomes possible to provide a left-channel and a right-channel stereo signal oppositely phased to each other in order to produce a cross-correlation coefficient of a minus sign. Such cross-correlation coefficient of the minus sign may be employed for generating special effects of producing an impression that the sound is being generated from outside the speaker.

With the above-described first embodiment of the quantization apparatus, the stereo dither signals $STD_1$, $STD_2$ having an arbitrary cross-correlation, obtained by mixing and combining non-correlated dither signals of three different routes by the stereo dither signal generating circuit 5 at an arbitrary mixing ratio, are supplied to the first dither addition circuit 3 provided upstream of the first quantizer 6 and to the second dither addition circuit 4, provided upstream of the second quantizer 7, respectively, so that it becomes possible to maintain the cross-correlation between the stereo signals.

Figure 5:
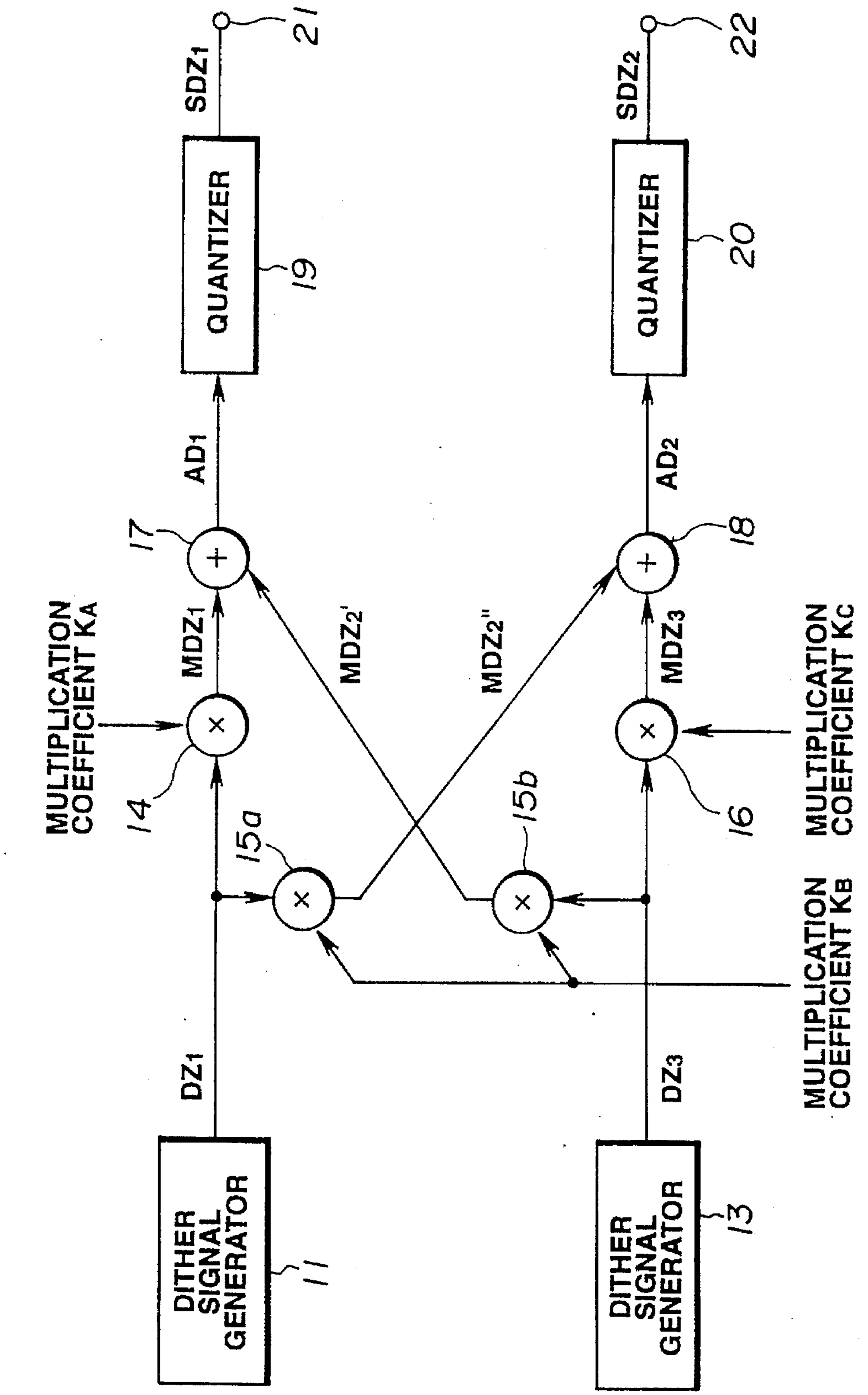
FIG. 5 is a block circuit diagram showing an arrangement of another stereo dither signal generating circuit in the embodiment shown in FIG. 1.

FIG. 3 shows a simplified arrangement of the stereo dither signal generator 5. The stereo dither signal generator shown in FIG. 5 includes dither signal generators 11, 13 for generating mutually non-correlated dither signals $DZ_1$, $DZ_2$, and multipliers 15*a*, 15*b* for multiplying the dither signals $DZ_1$, $DZ_2$ from the dither signal generators 11, 13 with the multiplication coefficient $K_B$ of a desired value. The stereo dither signal generator also includes multipliers 14, 16 for multiplying the dither signals $DZ_1$, $DZ_2$ from the dither signal generators 11, 13 with the multiplication coefficients $K_A$ and $K_B$ of desired values and an addition circuit 17 for summing an output $MDZ_2'$ of the multiplier 15*b* and an output $MDZ_1$ of the multiplier 14 together. The stereo dither signal generator also includes an addition circuit 18 for summing an output $MDZ_2''$ of the multiplier 15*a* and an output $MDZ_3$ of the multiplier 16 and quantizers 19, 20 for quantizing and word length limiting the addition outputs $AD_1$, $AD_2$ from these addition circuits 19, 20. The stereo dither signals $SDZ_1$, $SDZ_2$ are outputted by these quantizers 19, 20 so as to be supplied via output terminals 21, 22 to the first and second dither addition circuits 3 and 4, shown in FIG. 1, respectively.

If two dither signal generators are employed a described above, the circuit construction may be simplified significantly, although the cross-correlation coefficient of the stereo dither signals cannot be set to "0" or "1" completely and can only be set to some intermediate value.

Figure 6:
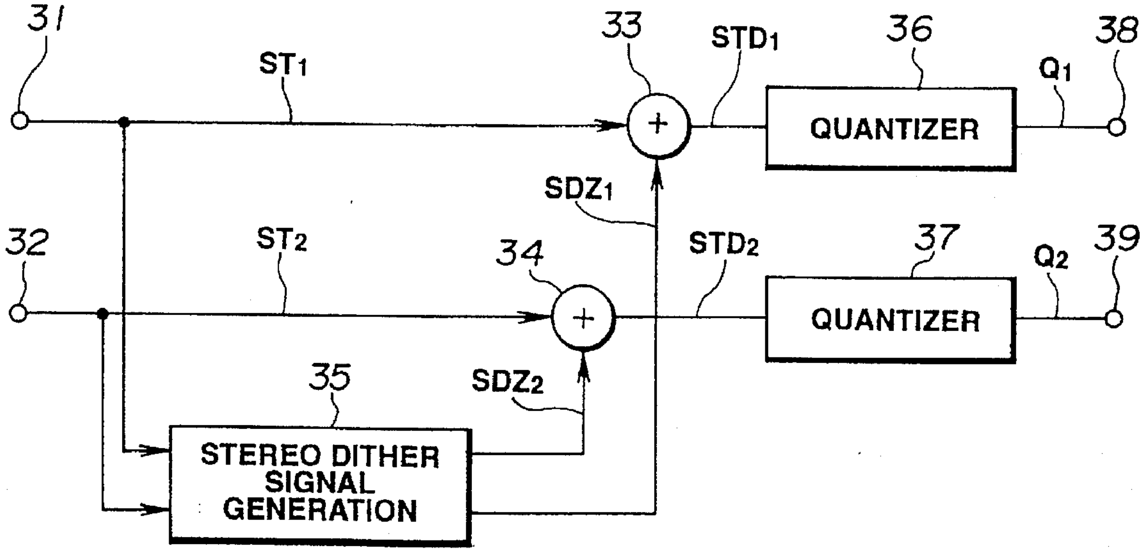
FIG. 6 is a block circuit diagram showing an arrangement of a second embodiment of the apparatus for quantization according to the present invention.
Figure 7:
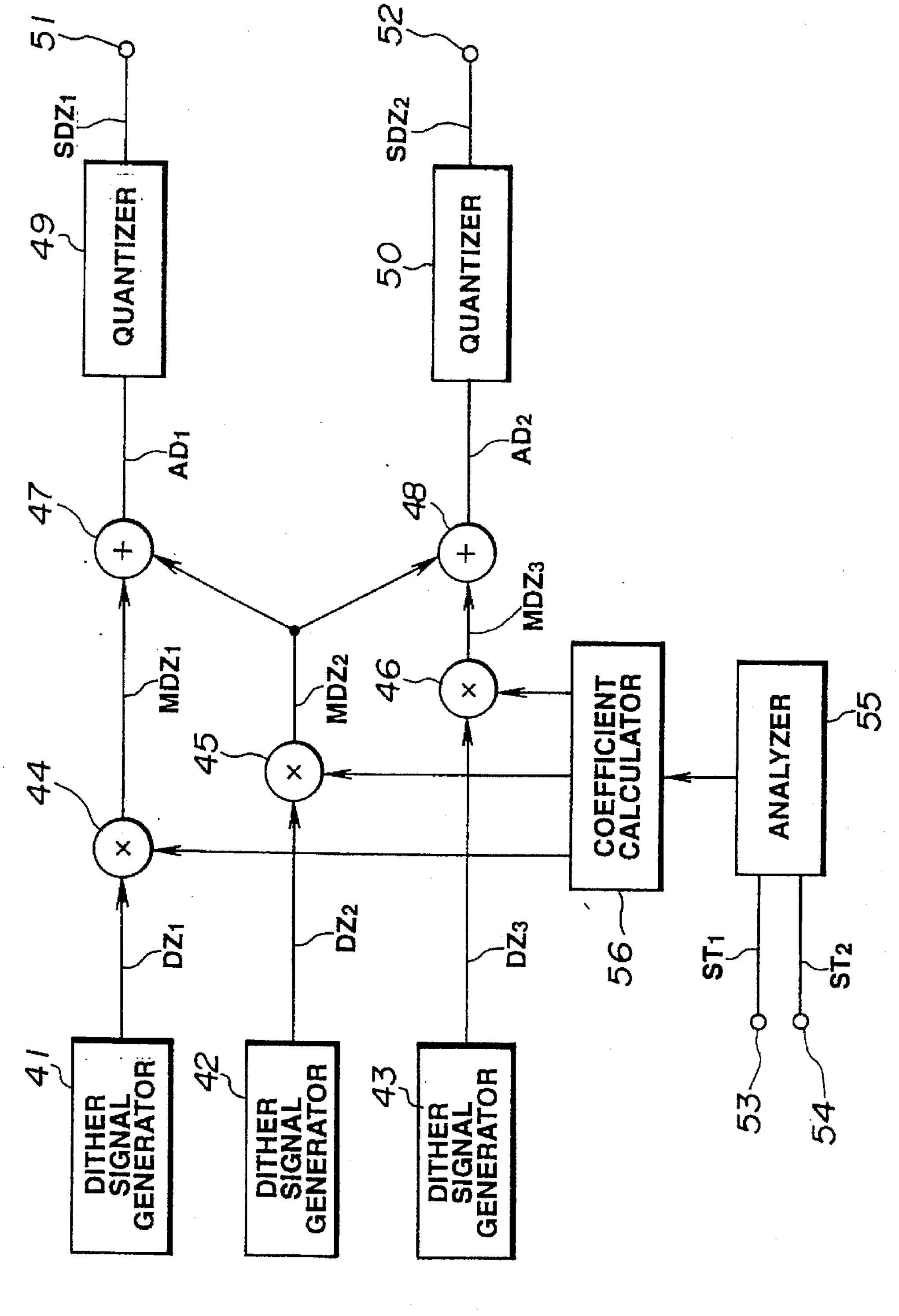
FIG. 7 is a block circuit diagram showing an arrangement of the stereo dither signal generating circuit in the embodiment shown in FIG. 6.

Referring to FIGS. 6 and 7, the second embodiment is explained.

The second embodiment is arranged as shown in FIG. 6.

That is, one $ST_1$ of stereo digital input signals, supplied via an input terminal 31, is inputted at a first dither signal addition circuit 33 and to a stereo dither signal generator 35 The other one $ST_2$ of stereo digital input signals, supplied via an input terminal 32, is inputted at a second dither signal addition circuit 34 and to a stereo signal dither generator 35.

The stereo dither signals $SDZ_1$, $SDZ_2$ also enter the first dither signal addition circuit 33 and the second dither signal generator 34, from the stereo dither signal generator 35, respectively. Thus the first dither signal addition circuit 33 adds the stereo dither signal $SDZ_1$ to the stereo input signal $ST_1$. The second dither signal addition node 34 adds the stereo dither signal $SDZ_2$ to the other stereo input signal $ST_2$.

The addition output $STD_1$ of the first dither addition circuit 33 is supplied to the first quantizer 36. The addition output $STD_2$ of the second dither addition node 34 is supplied to the second quantizer 37. The first quantizer 36 quantizes and word length limits the addition output $STD_1$ to route a quantized output $Q_1$ to an output terminal 38. The second quantizer 37 quantizes and word length limits the addition output $STD_2$ to route a quantized output $Q_2$ to an output terminal 39.

In the second embodiment, the stereo input signal is a 20 bit signal, while an output signal is a 16-bit signal and the stereo dither signal is a 4-bit signal. By adding the dither signal to the lower four bits of the stereo input signal, the information owned by minute signals of the stereo input signal is left in the output signal even after quantization from 20 bits to 16 bits.

The present second embodiment differs from the first embodiment in that the stereo dither signal generator 35 fetches the stereo input signal and analyzes the cross-correlation coefficients of the stereo input signal at an arbitrary time interval in order to generate the stereo dither signal having a cross-correlation coefficient which is the same as or an arbitrary number multiple of the cross-correlation coefficient of the stereo input signal.

Referring to FIG. 7, the stereo signal generator 35 includes three dither signal generators 41, 42 and 43 of three different routes for generating three non-correlated dither signals $DZ_1$, $DZ_2$, $DZ_3$ and an analyzer 55 for analyzing the cross-correlation coefficients $ST_1$, $ST_2$ via input terminals 53, 54 at an arbitrary time interval. The stereo signal generator 35 also includes a coefficient calculator 56 for calculating the cross-correlation coefficients of stereo input signals based upon the cross-correlation coefficients of the stereo dither signals $ST_1$ and $ST_2$ obtained by analysis by the analyzer 55, and multipliers 44, 45 and 46 for multiplying the dither signals. $DZ_1$, $DZ_2$, $DZ_3$ by arbitrary number multiples using the multiplication coefficients $K_A$, $K_B$, $K_C$ supplied from the coefficient calculator 56. The stereo signal generator also includes an addition circuit 47 for summing the multiplication outputs $MDZ_1$ and $MDZ_2$ among the multiplication outputs $MDZ_1$, $MDZ_2$ and $MDZ_3$ of the multipliers 44 to 46, an addition circuit 48 for summing the multiplication outputs $MDZ_2$ and $MDZ_3$ among the multiplication outputs $MDZ_1$, $MDZ_2$ and $MDZ_3$ and quantizers 49 and 50 for quantizing and word length limiting addition outputs $AD_1$ and $AD_2$ from the addition circuits 47 and 48. These quantizers 49 and 50 output stereo dither signals $SDZ_1$ and $SDZ_2$ which are supplied via output terminals 51 and 52 to the first dither addition node 93 and the second dither addition node 34, shown in FIG. 4, respectively.

The dither signal generators 41, 42 and 43 generate dither signals for the stereo left channel, dither signals for the stereo right channel and dither signals for both the stereo left and right channels.

Thus the stereo dither signal generator 35 adds to the product $MDZ_1$, obtained by multiplying the left channel dither signal $DZ_1$, generated by the dither signal generator 41, with the multiplication coefficient $K_A$, obtained via ananalyzer 55 and a coefficient calculator 56, and to the product $MDZ_3$, obtained by multiplying the right channel dithersignal $DZ_3$, generated by the dither signal generator 43, with the multiplication coefficient $K_C$, obtained via the analyzer 55 and the coefficient calculator 56, the product $MDZ_2$ obtained by multiplying the dither signal $DZ_2$ for both the lest and right channels, generated by the dither signal generator 42, with the multiplication coefficient $K_B$, obtained by the analyzer 55 and the coefficient calculator 56, to produce the results of addition $AD_1$ an $AD_2$, which are quantized and word length converted in order to produce stereo dither signals $SDZ_1$ and $SDZ_2$ having arbitrary cross-correlation coefficients.

In the present second embodiment, the cross-correlation coefficients owned by the stereo dither signals $SDZ_1$ and $SDZ_2$, that is the stereo dither cross-coefficients, may be explained by referring to FIGS. 3 and 4.

In addition, the cross-correlation coefficients having the minus sign may be obtained, as in the first embodiment.

Besides, two stereo dither signal generators may be employed for constituting the stereo dither signal generator.

With the above-described second embodiment of the quantization device, the cross-correlation of the stereo input signals is calculated at an arbitrary time interval, and the mixing ratio of the dither signals is adjusted for a pre-set time division so that the stereo dither signal will have the cross-correlation proportional to the calculated value, so that the cross-correlation of the stereo signals may be maintained more completely, while dropout of the information concerning the cross-correlation inherently owned by the stereo input signals may be diminished.

The present invention is not limited to the above-described first and second embodiments. For example, it may be applied to stereo panpot employed in a digital mixer.

What is claimed is:

1. A quantization apparatus for quantizing and word length limiting digital stereo input signals, comprising:

stereo dither signal generating means for generating stereo dither signals synthesized from distinct dither signals of at least two different routes, the stereo dither signals correlated to each other at a non-arbitrary ratio greater than zero;

first addition means for adding one of the stereo dither signals to one of the digital stereo input signals;

second addition means for adding the other of the stereo dither signals to the other of the digital stereo input signals;

first quantization means for quantizing and word length limiting an output signal of the first addition means; and second quantization means for quantizing and word length limiting an output signal of the second addition means.

2. A quantization apparatus for quantizing and word length limiting digital stereo input signals, comprising:

stereo dither signal generating means for generating stereo dither signals synthesized from distinct dither signals of at least two different routes not correlated to each other at an arbitrary ratio;

first addition means for adding one of the stereo dither signals to one of the digital stereo input signals;

second addition means for adding the other of the stereo dither signals to the other of the digital stereo input signals;

first quantization means for quantizing and word length limiting an output signal of the first addition means; and second quantization means for quantizing and word length limiting an output signal of the second addition means, wherein the stereo dither signal generating means comprises, first and second dither signal generating means for generating first and second dither signals not correlated with each other, first multiplication means for multiplying the first dither signal with an arbitrary coefficient, second multiplication means for multiplying the second dither signal with an arbitrary coefficient, third addition means for adding a multiplication output of the first multiplication means to the second dither signal, fourth addition means four adding a multiplication output of the second multiplication means to the first dither signal, and third and fourth quantization means for quantizing outputs of the third and fourth addition means, respectively.

3. A quantization apparatus for quantizing and word length limiting digital stereo input signals, comprising:

stereo dither signal generating means for generating stereo dither signals synthesized from distinct dither signals of at least two different routes not correlated to each other at an arbitrary ratio;

first addition means for adding one of the stereo dither signals to one of the digital stereo input signals;

second addition means for adding the other of the stereo dither signals to the other of the digital stereo input signals;

first quantization means for quantizing and word length limiting an output signal of the first addition means; and second quantization means for quantizing and word length limiting an output signal of the second addition means, wherein the stereo dither signal generating means comprises first, second and third dither signal generating means for generating first, second and third dither signals not correlated with one another, first multiplication means for multiplying the third dither signal with an arbitrary coefficient, third and fourth addition means for adding a multiplication output of the first multiplication means to the first and second dither signals, and third and fourth quantization means for quantizing outputs of the third and fourth addition means, respectively.

4. A quantization apparatus for quantizing and word length limiting digital stereo input signals, comprising:

stereo dither signal generating means for generating stereo dither signals synthesized from distinct dither signals of at least two different routes not correlated to each other at an arbitrary ratio, wherein the stereo dither signal generating means controls a mixing ratio of the dither signals of at least two channels not correlated, with each other based upon the cross-correlation of the stereo input signals;

first addition means for adding one of the stereo dither signals to one of the digital stereo input signals;

second addition means for adding the other of the stereo dither signals to the other of the digital stereo input signals;

first quantization means for quantizing and word length limiting an output signal of said first addition means; and second quantization means for quantizing and word length limiting an output signal of said second addition means.

5. A quantization apparatus for quantizing and word length limiting digital stereo input signals, comprising:

stereo dither signal generating means for generating stereo dither signals synthesized from distinct dither signals of at least two different routes not correlated to each other at an arbitrary ratio;

first addition means for adding one of the stereo dither signals to one of the digital stereo input signals;

second addition means for adding the other of the stereo dither signals to the other of the digital stereo input signals;

first quantization means for quantizing and word length limiting an output signal of the first addition means; and second quantization means for quantizing and word length limiting an output signal of the second addition means, wherein the stereo dither signal generating means comprises means for analyzing the cross-correlation coefficients of the stereo input signals at a pre-set time interval, and means for calculating cross-correlation coefficients of the stereo dither signals based upon the cross-correlation coefficients of the stereo input signals obtained from the analysis means, the stereo signal generating means generating stereo dither signals having a cross-correlation coefficient equal to the cross-correlation coefficient of the stereo input signal or to an arbitrary number multiple of the cross-correlation coefficient of the stereo input signal.

6. A method for quantizing and word length limiting digital stereo input signals, comprising the steps of:

generating stereo dither signals synthesized from distinct dither signals of at least two different routes, the stereo dither signals correlated to each other at a non-arbitrary ratio greater than zero;

adding one of the stereo dither signals to one of the digital stereo input signals;

adding the other of the stereo dither signals to the other of the digital stereo input signals;

quantizing and word length limiting an output signal of the addition of the one of the stereo dither signals to the one of the digital stereo input signals; and quantizing and word length limiting an output signal of the addition of the other of the stereo dither signals and the other of the digital stereo input signals.

7. A method for quantizing and word length limiting digital stereo input signals, comprising the steps of:

generating stereo dither signals synthesized from distinct dither signals of at least two different routes not correlated to each other at an arbitrary ratio, by separately generating first and second dither signals not correlated with each other, multiplying the first dither signal with a first arbitrary coefficient, multiplying the second dither signal with a second arbitrary coefficient, adding the multiplied first dither signal to the second dither signal to generate a first added output signal, adding the multiplied second dither signal to the first dither signal to generate a second added output signal, quantizing the first added output signal, and quantizing the second added output signal;

adding one of the stereo dither signals to one of the digital stereo input signals;

adding the other of the stereo dither signals to the other of the digital stereo input signals;

quantizing and word length limiting an output signal of the addition of the one of the stereo dither signals to the one of the digital stereo input signals; and quantizing and word length limiting an output signal of the addition of the other of the stereo dither signals and the other of the digital stereo input signals.

8. A method for quantizing and word length limiting digital stereo input signals, comprising the steps of:

generating stereo dither signals synthesized from distinct dither signals of at least two different routes not correlated to each other at an arbitrary ratio, by generating first, second and third dither signals not correlated with one another, multiplying the third dither signal with an first arbitrary coefficient, adding the multiplied third dither signal to the first dither signal to generate a first added output signal, adding the multiplied third dither signal to the second dither signal to generate a second added output signal, quantizing the first added output signal, and quantizing the second added output signal;

adding one of the stereo dither signals to one of the digital stereo input signals;

adding the other of the stereo dither signals to the other of the digital stereo input signals;

quantizing and word length limiting an output signal of the addition of the one of the stereo dither signals to the one of the digital stereo input signals; and quantizing and word length limiting an output signal of the addition of the other of the stereo dither signals and the other of the digital stereo input signals.

9. A method for quantizing and word length limiting digital stereo input signals, comprising the steps of:

generating stereo dither signals synthesized from distinct dither signals of at least two different routes not correlated to each other at an arbitrary ratio by controlling a mixing ratio of the dither signals of at least two channels not correlated with each other based upon the cross-correlation of the stereo input signals;

adding one of the stereo dither signals to one of the digital stereo input signals;

adding the other of the stereo dither signals to the other of the digital stereo input signals;

quantizing and word length limiting an output signal of the addition of the one of the stereo dither signals to the one of the digital stereo input signals; and quantizing and word length limiting an output signal of the addition of the other of the stereo dither signals and the other of the digital stereo input signals.

10. A method for quantizing and word length limiting digital stereo input signals, comprising the steps of:

generating stereo dither signals synthesized from distinct dither signals of at least two different routes not correlated to each other at an arbitrary ratio by controlling a mixing ratio of the dither signals of at least two channels not correlated with each other based upon the cross-correlation of the stereo input signals, analyzing the cross-correlation coefficients of the stereo input signals at a pre-set time interval, calculating cross-correlation coefficients of the stereo dither signals based upon the cross-correlation coefficients of the stereo input signals obtained from the analysis means, and generating stereo dither signals having a cross-correlation coefficient equal to the cross-correlation coefficient of the stereo input signal or to an arbitrary number multiple of the cross-correlation coefficient of the stereo input signal;

adding one of the stereo dither signals to one of the digital stereo input signals;

adding the other of the stereo dither signals to the other of the digital stereo input signals;

quantizing and word length limiting an output signal of the addition of the one of the stereo dither signals to the one of the digital stereo input signals; and quantizing and word length limiting an output signal of the addition of the other of the stereo dither signals and the other of the digital stereo input signals.

11. A quantization apparatus for quantizing and word length limiting digital stereo input signals, comprising:

a stereo dither signal generator for generating stereo dither signals synthesized from distinct dither signals of at least two different routes, the stereo dither signals correlated to each other at a non-arbitrary ratio greater than zero;

a first adder for adding one of the stereo dither signals to one of the digital stereo input signal;

a second adder for adding the other of the stereo dither signals to the other of the digital stereo input signal;

a first quantizer for quantizing and word length limiting an output signal of the first adder; and a second quantizer for quantizing and word length limiting an output signal of the second adder.

12. A quantization apparatus for quantizing and word length limiting digital stereo input signals, comprising:

a stereo dither signal generator for generating stereo dither signals synthesized from distinct dither signals of at least two different routes not correlated to each other at an arbitrary ratio;

a first adder for adding one of the stereo dither signals to one of the digital stereo input signals;

a second adder for adding the other of the stereo dither signals to the other of the digital stereo input signals;

a first quantizer for quantizing and word length limiting an output signal of the first adder; and a second quantizer for quantizing and word length limiting an output signal of the second adder, wherein the stereo dither signal generator comprises, first and second dither signal generators for generating first and second dither signals not correlated with each other, a first multiplier for multiplying the first dither signal with an arbitrary coefficient, a second multiplier for multiplying the second dither signal with an arbitrary coefficient, a third adder for adding a multiplication output of the first multiplier to the second dither signal, a fourth adder for adding a multiplication output of the second multiplier to the first dither signal, and third and fourth quantizers for quantizing outputs of the third and fourth adders, respectively.

13. A quantization apparatus for quantizing and word length limiting digital stereo input signals, comprising:

a stereo dither signal generator for generating stereo dither signals synthesized from distinct dither signals of at least two different routes not correlated to each other at an arbitrary ratio;

a first adder for adding one of the stereo dither signals to one of the digital stereo input signals;

a second adder for adding the other of the stereo dither signals to the other of the digital stereo input signals;

a first quantizer quantizing and word length limiting an output signal of the first adder; and a second quantizer for quantizing and word length limiting an output signal of the second adder, wherein the stereo dither signal generator comprises first, second and third dither signal generators for generating first, second and third dither signals not correlated with one another, a first multiplier for multiplying the third dither signal with an arbitrary coefficient, third and fourth adders for adding a multiplication output of the first multiplier to the first and second dither signals, and third and fourth quantizes for quantizing outputs of the third and fourth adders, respectively.

14. A quantization apparatus for quantizing and word length limiting digital stereo input signals, comprising:

a stereo dither signal generator for generating stereo dither signals synthesized from distinct dither signals of at least two different routes not correlated to each other at an arbitrary ratio, wherein the stereo dither signal generator controls a mixing ratio of the dither signals of at least two channels not correlated with each other based upon the cross-correlation of the stereo input signals;

a first adder for adding one of the stereo dither signals to one of the digital stereo input signals;

a second adder for adding the other of the stereo dither signals to the other of the digital stereo input signals;

a first quantizer for quantizing and word length limiting an output signal of said first adder; and a second quantizer for quantizing and word length limiting an output signal of said second adder.

15. A quantization apparatus for quantizing and word length limiting digital stereo input signals, comprising:

a stereo dither signal generator for generating stereo dither signals synthesized from distinct dither signals of at least two different routes not correlated to each other at an arbitrary ratio;

a first adder for adding one of the stereo dither signals to one of the digital stereo input signals;

a second adder for adding the other of the stereo dither signals to the other of the digital stereo input signals;

a first quantizer for quantizing and word length limiting an output signal of the first adder; and a second quantizer for quantizing and word length limiting an output signal of the second adder, wherein the stereo dither signal generator comprises an analyzer for analyzing the cross-correlation coefficients of the stereo input signals at a pre-set time interval, and a calculator for calculating cross-correlation coefficients of the stereo dither signals based upon the cross-correlation coefficients of the stereo input signals obtained from the analyzer, the stereo signal generator generating stereo dither signals having a cross-correlation coefficient equal to the cross-correlation coefficient of the stereo input signal or to an arbitrary number multiple of the cross-correlation coefficient of the stereo input signal.

* * * * *

UNITED STATES PATENT AND TRADEMARK OFFICE

CERTIFICATE OF CORRECTION

PATENT NO. : 5,627,535
DATED : May 6, 1997
INVENTOR(S) : GEN ICHIMURA ET AL.

It is certified that error appears in the above-indentified patent and that said Letters Patent is hereby corrected as shown below:

Col. 7, line 36, "four" should be --for--.

Signed and Sealed this

Seventh Day of October, 1997

Attest:

Bruce Lehman

BRUCE LEHMAN

*Attesting Officer* *Commissioner of Patents and Trademarks*